United States Patent [19]

Kim

[11] Patent Number: 5,561,422
[45] Date of Patent: Oct. 1, 1996

[54] METHOD AND APPARATUS FOR VARIABLE LENGTH CODING WITH REDUCED MEMORY REQUIREMENT

[75] Inventor: Kyung-Jin Kim, Incheon, Rep. of Korea

[73] Assignee: Daewoo Electronics Co., Ltd., Seoul, Rep. of Korea

[21] Appl. No.: 242,914

[22] Filed: May 16, 1994

[51] Int. Cl.⁶ .................................................. H03M 7/40
[52] U.S. Cl. ............................................ 341/67; 341/106
[58] Field of Search ............................ 341/65.67, 106

[56] References Cited

U.S. PATENT DOCUMENTS

| | | | |
|---|---|---|---|
| 4,937,573 | 6/1990 | Silvio et al. | 341/67 |
| 5,166,684 | 11/1992 | Juri et al. | 341/67 |
| 5,325,092 | 6/1994 | Allen et al. | 341/65 |

OTHER PUBLICATIONS

Lei et al., *An Entropy Coding System for Digital HDTV Applications*, IEEE Transactions on Circuits and Systems for Video Technology, vol. 1, No. 1, Mar. 1991, pp. 147–155.

*Primary Examiner*—Howard L. Williams
*Attorney, Agent, or Firm*—Anderson Kill Olick & Oshinsky, P.C.

[57] ABSTRACT

An encoding apparatus having a 16-bit read-only-memory-(ROM) and a general 16-bit microprocessor comprises: means for storing variable length code table data which is originally of 18 bit length in said ROM, means for processing a source code inputted from an input line in said microprocessor to convert said source code into an appropriate form for accessing said variable length code table data stored in said ROM so as to determine the length of the variable length code, and means for transmitting said variable length code of said determined length through a transmission line.

10 Claims, 4 Drawing Sheets

METHOD AND APPARATUS FOR VARIABLE LENGTH CODING WITH REDUCED MEMORY REQUIREMENT

FIELD OF THE INVENTION

The present invention relates to a method and apparatus for encoding a digital signal into a variable length code(VLC); and, more particularly, to a VLC encoder built on a novel method which makes use of a VLC look-up table stored in a 16-bit ROM(read-only-memory) to encode a source code into a VLC, which is originally of an 18 bit length, to thereby economize the memory space needed to store the VLC look-up table.

DESCRIPTION OF THE PRIOR ART

Transmission systems for digital signals normally include a quantizer, a prediction scheme, an encoder, a buffer, control circuitry and the like. The term "encoder" as used in the art sometimes refers to the entire transmission system and at other times refers merely to the encoding aspect of a coder circuit within the transmission system. The term as used herein shall mean the latter.

Inasmuch as the bandwidth available in a transmission channel is limited, it is desirable to compress, as large an extent as possible, the data to be transmitted. Numerous schemes have been developed for increasing the efficiency of such data compression while maintaining the integrity of the image transmitted.

One of such compression methods is known as variable length coding. The variable length coding is a statistical coding technique that assigns codewords to the source code data to be encoded: data occurring in high frequencies are assigned shorter codewords; and those of less frequent occurrences are assigned longer codewords.

According to the MPEG and CCITT standard recommendation, a VLC consists of a codeword of up to 14 bits representing a maximum run-length of 63 and a level ranging from –127 to 127, and 4 most significant bits(MSB) representing the codeword length, resulting in the maximum VLC length of 18 bits. As used herein, the term 'run-length' means the number of successive runs with a zero value; and the non-zero value following the successive zeros is called a level. The run-length and level data may be encoded by using a look-up table such as Table I. As used in Table I, which contains those common combinations of run-length and level only, the last bit 's' of a codeword denotes the sign of the level; 0 means a positive level and 1 means a negative level. In other words, if the non-zero value after successive zeros is positive, 0 is filled in the position of 's', and if the value is negative, 1 is provided therein. As shown in Table I, a codeword has a maximum 14 bit length including the level sign,

TABLE I

| RUN | LEVEL | CODE | | | | RUN | LEVEL | CODE | | | |
|---|---|---|---|---|---|---|---|---|---|---|---|
| EOB | | 10 | | | | | | | | | |
| 0 | 1 | 1s | if first | | | 5 | 1 | 0001 | 11s | | |
| 0 | 1 | 11s | if not first | | | 5 | 2 | 0000 | 0010 | 01s | |
| 0 | 2 | 0100 | s | | | 5 | 3 | 0000 | 0000 | 1001 | 0s |
| 0 | 3 | 0010 | 1s | | | | | | | | |
| 0 | 4 | 0000 | 110s | | | 6 | 1 | 0001 | 01s | | |
| 0 | 5 | 0010 | 0110 | s | | 6 | 2 | 0000 | 0001 | 1110 | s |
| 0 | 6 | 0010 | 0001 | s | | | | | | | |
| 0 | 7 | 0000 | 0010 | 10s | | 7 | 1 | 0001 | 00s | | |
| 0 | 8 | 0000 | 0001 | 1101 | s | 7 | 2 | 0000 | 0001 | 0101 | s |
| 0 | 9 | 0000 | 0001 | 1000 | s | | | | | | |
| 0 | 10 | 0000 | 0001 | 0011 | s | 8 | 1 | 0000 | 111s | | |
| 0 | 11 | 0000 | 0001 | 0000 | s | 8 | 2 | 0000 | 0001 | 0001 | s |
| 0 | 12 | 0000 | 0000 | 1101 | 0s | | | | | | |
| 0 | 13 | 0000 | 0000 | 1100 | 1s | 9 | 1 | 0000 | 101s | | |
| 0 | 14 | 0000 | 0000 | 1100 | 0s | 9 | 2 | 0000 | 0000 | 1000 | 1s |
| 0 | 15 | 0000 | 0000 | 1011 | 1s | | | | | | |
| | | | | | | 10 | 1 | 0010 | 0111 | s | |
| 1 | 1 | 011s | | | | 10 | 2 | 0000 | 0000 | 1000 | 0s |
| 1 | 2 | 0001 | 10s | | | | | | | | |
| 1 | 3 | 0010 | 0101 | s | | 11 | 1 | 0010 | 0011 | s | |
| 1 | 4 | 0000 | 0011 | 00s | | 12 | 1 | 0010 | 0010 | s | |
| 1 | 5 | 0000 | 0001 | 1011 | s | 13 | 1 | 0010 | 0000 | s | |
| 1 | 6 | 0000 | 0000 | 1011 | 0s | 14 | 1 | 0000 | 0011 | 10s | |
| 1 | 7 | 0000 | 0000 | 1010 | 1s | 15 | 1 | 0000 | 0011 | 01s | |
| | | | | | | 16 | 1 | 0000 | 0010 | 00s | |
| 2 | 1 | 0101 | s | | | 17 | 1 | 0000 | 0001 | 1111 | s |
| 2 | 2 | 0000 | 100s | | | 18 | 1 | 0000 | 0001 | 1010 | s |
| 2 | 3 | 0000 | 0010 | 11s | | 19 | 1 | 0000 | 0001 | 1001 | s |
| 2 | 4 | 0000 | 0001 | 0100 | s | 20 | 1 | 0000 | 0001 | 0111 | s |
| 2 | 5 | 0000 | 0000 | 1010 | 0s | 21 | 1 | 0000 | 0001 | 0110 | s |
| | | | | | | 22 | 1 | 0000 | 0000 | 1111 | 1s |
| 3 | 1 | 0011 | 1s | | | 23 | 1 | 0000 | 0000 | 1111 | 0s |
| 3 | 2 | 0010 | 0100 | s | | 24 | 1 | 0000 | 0000 | 1110 | 1s |
| 3 | 3 | 0000 | 0001 | 1100 | s | 25 | 1 | 0000 | 0000 | 1110 | 0s |
| 3 | 4 | 0000 | 0000 | 1001 | 1s | 26 | 1 | 0000 | 0000 | 1101 | 1s |
| 4 | 1 | 0011 | 0s | | | | | | | | |
| 4 | 2 | 0000 | 0011 | 11s | | | | | | | |
| 4 | 3 | 0000 | 0001 | 0010 | s | ESCAPE | | 0000 | 01 | | | and together with the 4 bits used to represent the codeword length (which are not included in Table I), constitutes a maximum of 18-bit VLC.

A look-up table, e.g., Table I, together with the 4-bit codeword length data, is stored in a memory, e.g., a ROM. The encoding process can be implemented by using the run-length and level data to address the table. The codewords and the codeword length data may be stored as the contents of the table; and outputted sequentially at a Constant data rate to a transmission channel.

In the above VLC encoding technique, however, a large scale memory, e.g., 24-bit ROM, is to be used to store the 18-bit VLC look-up table data in accordance with the MPEG and CCITT standard recommendation, which makes the system costly.

Furthermore, if a 16-bit ROM is used rather than a 24-bit ROM, the VLC look-up table should be accessed twice to read out an 18-bit VLC, which reduces the coding efficiency.

SUMMARY OF THE INVENTION

It is, therefore, an objective of the present invention to provide a method and apparatus for encoding digital signals into a VLC, which is capable of optimizing the memory space needed to store VLC look-up table data.

It is another objective of the present invention to provide a method and apparatus for storing the MPEG and CCITT standard VLC look-up table data in a 16-bit ROM.

In accordance with the present invention, there is provided a novel method and apparatus for encoding a digital source code for the transmission thereof into a VLC, comprising the steps of:

converting the source code in a microprocessor into an appropriate form for accessing a variable length code table data stored in a 16-bit memory;

processing a variable length code read from the variable length code table to determine the length thereof; and transmitting the processed variable length code of the determined length.

BRIEF DESCRIPTION OF THE DRAWINGS

The above and other objectives and features of the present invention will become apparent from the following description of preferred embodiments given in conjunction with the accompanying drawings, in which.

DETAILED DESCRIPTION OF THE PREFERRED EMBODIMENTS

Figure 1:
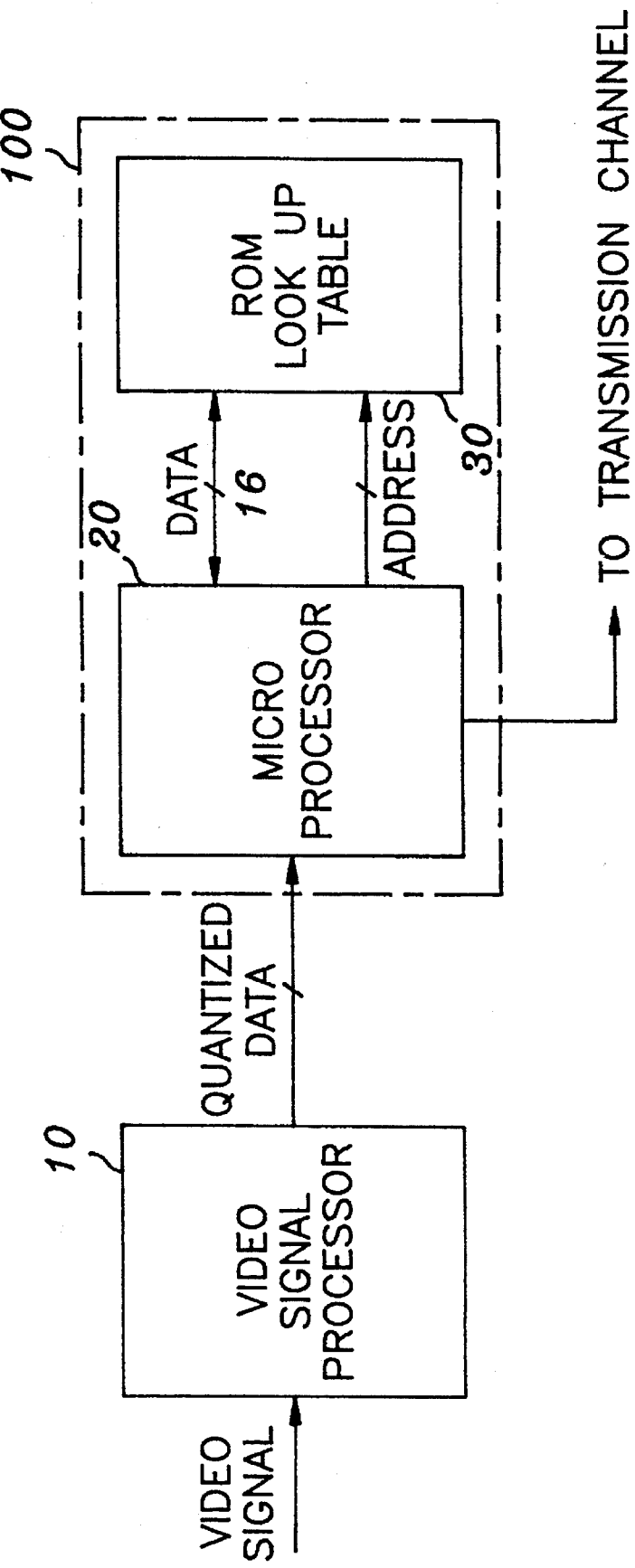
FIG. 1 is a block diagram of a VLC encoder having a microprocessor and a ROM.

Referring to FIG. 1, there is shown a block diagram of a VLC encoder 100, which comprises a microprocessor 20 and a read-only-memory(ROM) 30.

Since the variable length coding can efficiently compress data without any loss thereof, it is used in various digital image processing applications for encoding and compressing DC and AC transform coefficients which are obtained by DCT (discrete cosine transform) operation of an image signal followed by the quantization thereof. See Ming-Ting Sun et al., "An Entropy Coding System for Digital HDTV Applications", *IEEE Transactions on Circuits and Systems for Video Technology*, 1, No. 1 (March, 1991).

In such digital image processing applications, each block of 8×8 elements is normally projected from the spatial domain to the frequency domain using DCT. Thereafter, each array of 8×8 coefficients produced by the DCT operation is quantized to produce an 8×8 array of quantized coefficients. In general, the number of non-zero quantized coefficients is quite small, which makes the compression scheme more practicable.

In an 8×8 array of quantized coefficients, the top left coefficient; is called the DC coefficient, and the remaining are called AC coefficients.

The quantized DC coefficient can be encoded without any loss or sacrifice thereof by using a DPCM(differential pulse code modulation) technique.

The quantized AC coefficients are first scanned in a zigzag order to increase the coding efficiency. Then, the AC coefficients are encoded using the run-length and level data thereof. The use of zigzag scanning is preferred since it gives fewer zero runs and allows encoding with shorter VLC's.

A video signal processor 10 takes a video signal as an input and processes the video signal as described above to output the zigzag scanned and quantized AC coefficients to the microprocessor 20. The microprocessor 20 reads the quantized AC coefficients as a source code from the video signal processor 10.

Thereafter, the microprocessor 20 serves to determine the run-length and level of the input source code; and store the sign of the determined level therein. The microprocessor 20 then addresses a VLC look-up table stored in the ROM 30 with the determined run-length and level, and processes a VLC read from the VLC look-up table in accordance with the present invention.

A 16-bit ROM is used to store the VLC look-up table in a preferred embodiment of the present invention. A VLC, as recommended by the MPEG and CCITT, has a maximum of 18 bit length which represents up to 63 run-length and a level ranging from −127 to 127. In the preferred embodiment of the present invention, however, a VLC can be stored in the 16-bit ROM, thus minimizing the memory space as described below with reference to FIG. 2.

Figure 2:
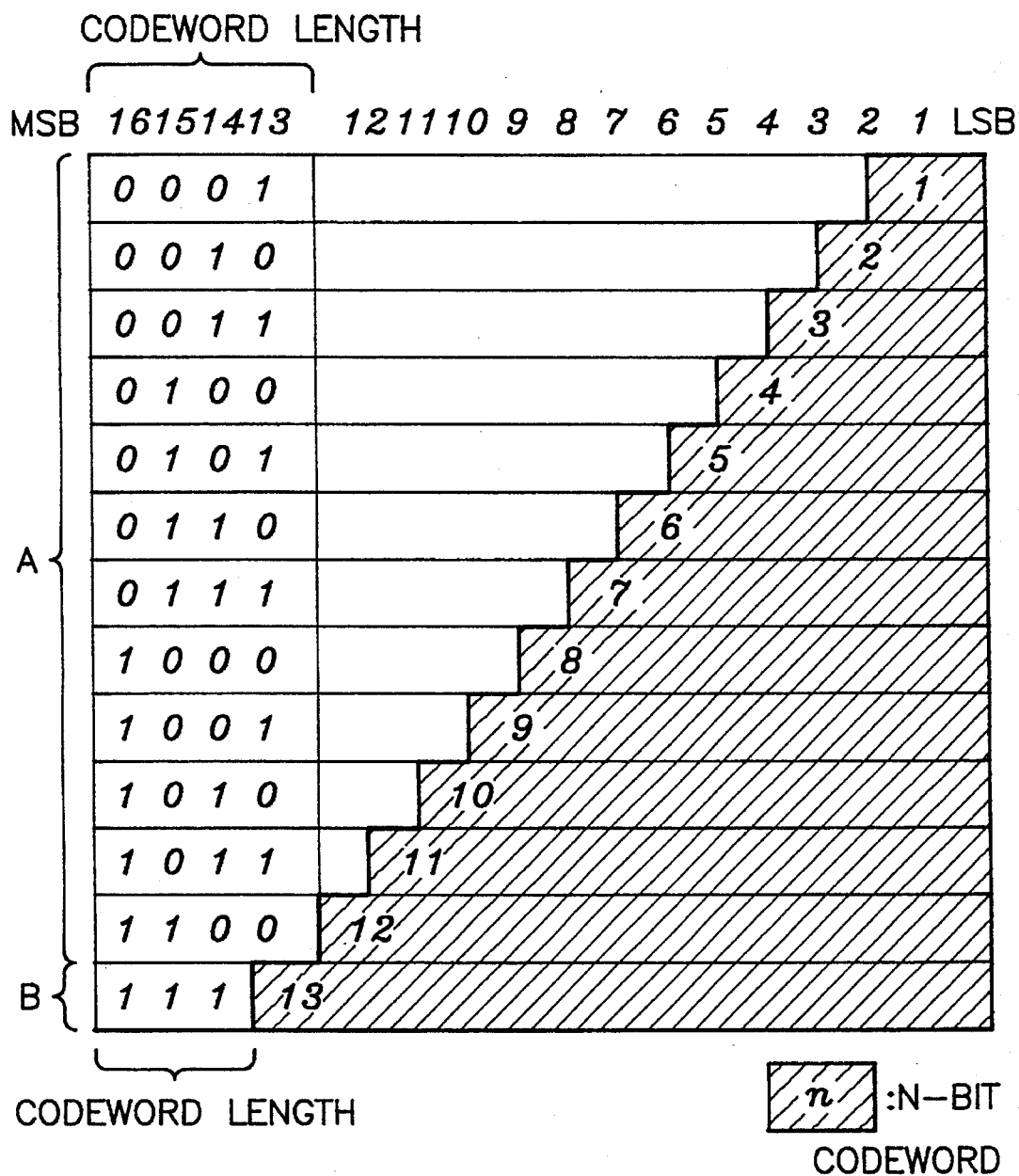
FIG. 2 represents the structure of a 16-bit VLC look-up table stored in the ROM of FIG. 1.

FIG. 2 shows how a VLC is stored in the ROM 30 in accordance with the present invention. The table shown in FIG. 2 does not contain the sign data of the level. The sign data is processed using a method which will be described hereinafter with reference to FIG. 3.

In FIG. 2, n least significant bits(LSB's) of the n-th line contain the codeword of n-bit length wherein n is an integer from 1 to 13; and 4 MSB's in case of part A or 3 MSB's in case of part B represent the codeword length 'n' of the codeword. In a binary operation, up to 16 pieces of data can be represented using 4 bits (i.e., from '0000' to '1111'); however, only 13 pieces of data, each representing the codeword length of VLC's from 1 to 13, are required in the preferred embodiment of the present invention. Accordingly, the memory portion used to represent the codeword length can be reduced, resulting in the reduction of the space required to store the look-up table data in the ROM 30. In the preferred embodiment of the present invention, out of the 4-bit storage capacity which can represent or accommodate 16 pieces of data, only 12 pieces of data shown in part A of FIG. 2 are stored: that is, '0000', '1101', '1110' and '1111' are not used. To reduce the storage requirement for the VLC's in accordance with the present invention, 4 bits, as shown in part A, are assigned to represent the codewords with their length being shorter than or equal to 12 bits; and a 3-bit code consisting of 1's, as shown in part B, is assigned to represent a codeword having a 13 bit length. Since there is no codeword length starting with three successive 1's as can be seen from part A of FIG. 2, there can lie no confusion between those codewords having a length of up to 12 bits and the codeword having the 13-bit length represented by '111'.

In this manner, if the length of a codeword is shorter than or equal to 12 bits, the number of bits required to represent the VLC's becomes fewer than or equal to 16; and if a codeword is 13 bit long, the total number of bits required to represent the VLC becomes 16. In this manner, the 18-bit VLC's, according to the MPEG and CCITT standard recommendation, can be represented using 16 bits only by processing the sign of the codeword outside the ROM 30. Consequently, all the information provided in Table I can be expressed as in FIG. 2 requiring a 16-bit memory space only.

Figure 3A:
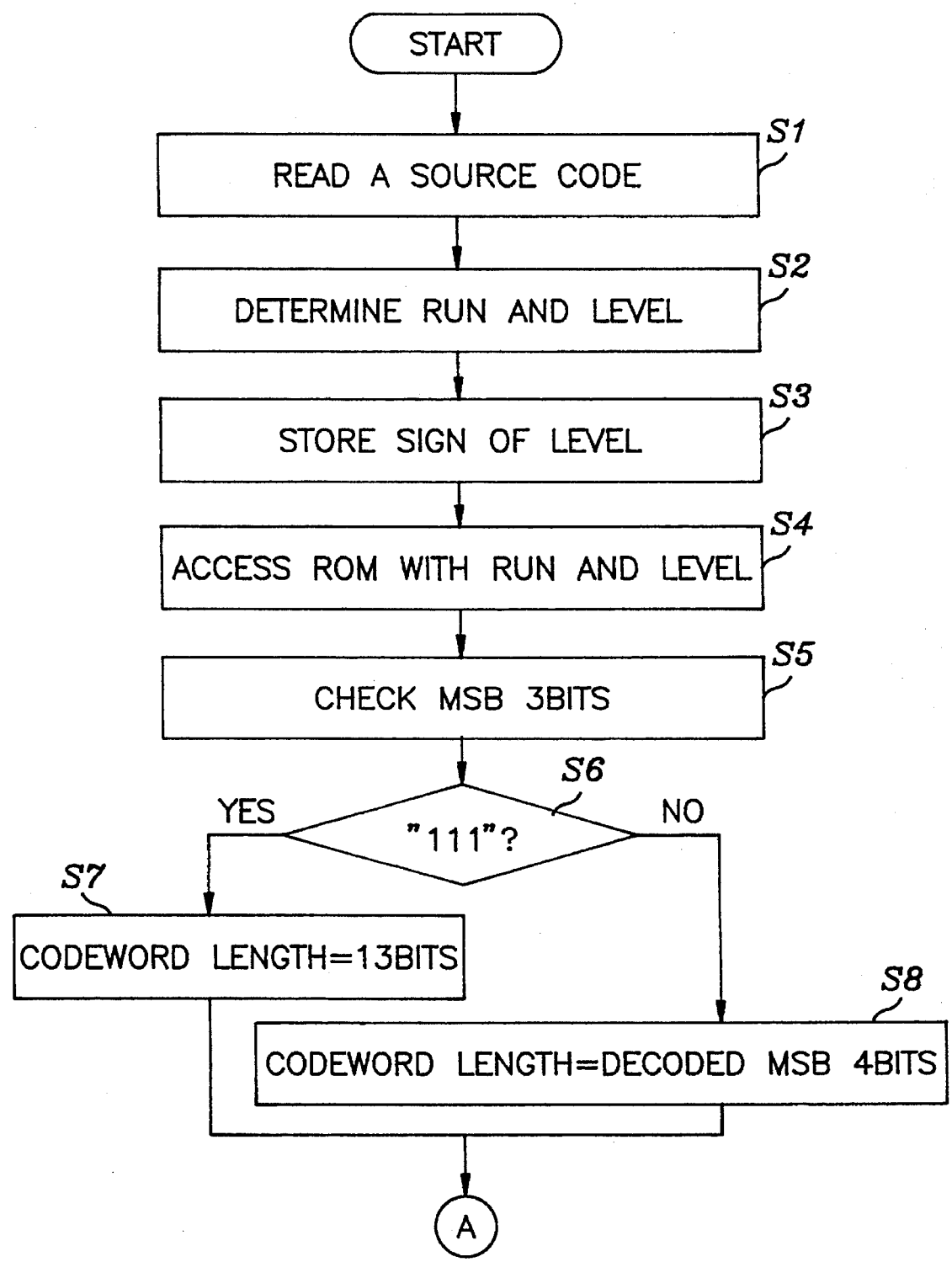
FIG. 3 is a flow chart illustrating the inventive method for encoding a digital signal into a VLC.
Figure 3B:
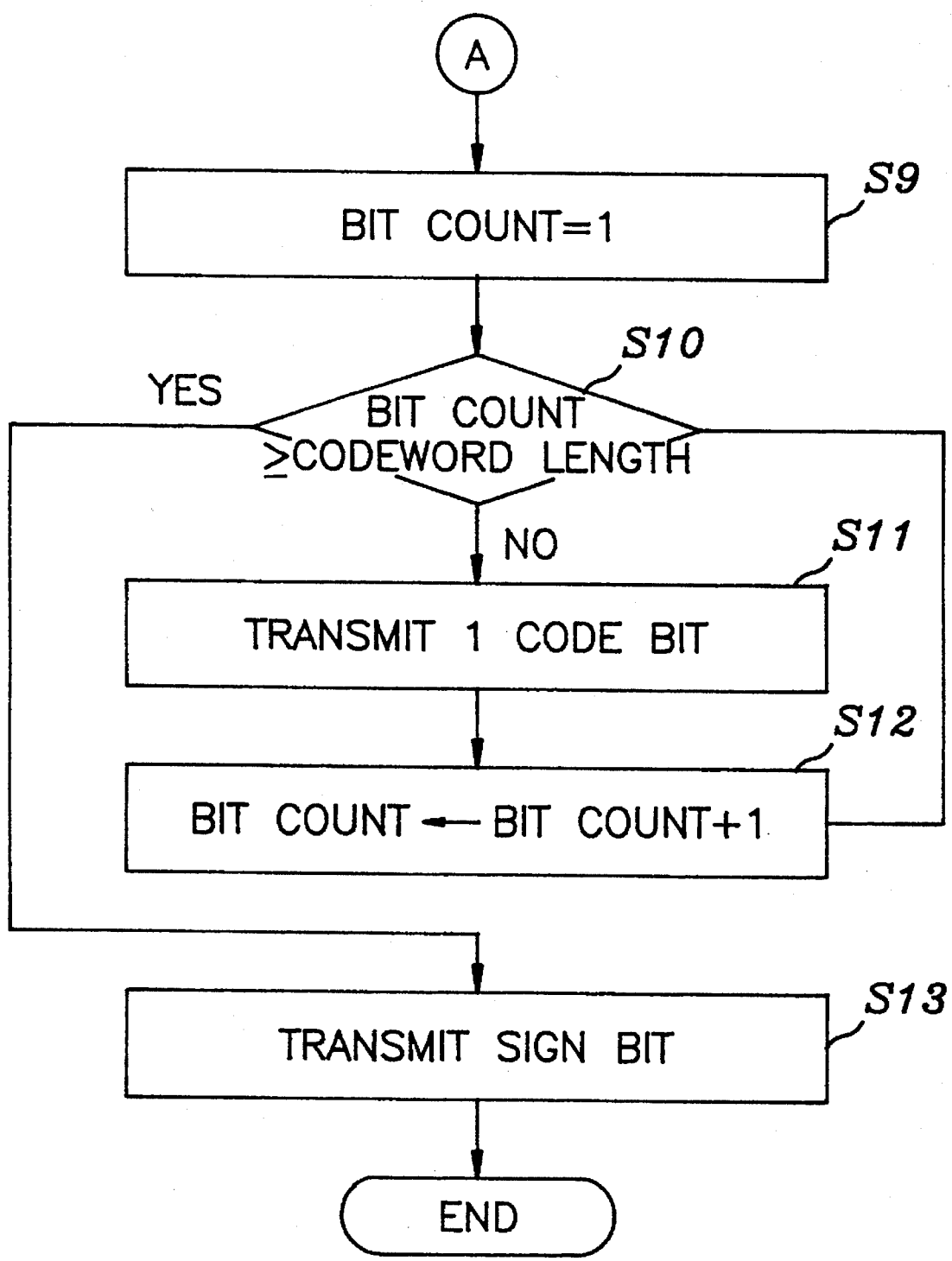

FIGS. 3A and 3B are flow chart illustrating the inventive method for encoding a source code into a VLC using a VLC look-up table data stored in a 16-bit ROM. In step S1, the microprocessor 20 reads the zigzag scanned and quantized AC coefficients from the video signal processor 10 as a source code. In step S2, the microprocessor 20 determines the run-length and level of the source code to be encoded. In step S3, the sign of the determined level is stored in a buffer within the microprocessor 20.

In step S4, the microprocessor 20 accesses the VLC look-up table stored in the ROM 30 with the determined run-length and level data, and reads a maximum 16-bit VLC at the accessed address.

At step S5, the microprocessor 20 checks the 3 MSB's of the VLC. If the 3-bit representation of a codeword length is made of all 1's, the codeword length is determined as 13 bit long at step S7. If not, the codeword length is determined by decoding the 4 MSB's in step S8.

After the codeword length has been determined, transfer of the codeword of the determined length starts. At step S9, the microprocessor 20 sets the bit count as 1. In steps S10 S11, and S12, until the bit count becomes greater than or equal to the codeword length determined in step S7 or step S8, each codeword is transferred bit by bit through a serial port incorporated in the microprocessor 20 to a transmission channel, while increasing the bit count by 1 at a time.

Referring to step S13, after all the VLC data is transferred sequentially, the sign stored in step S3 is transferred to the transmission channel. If the sign of the level is positive, 0 is transferred; and if negative, 1 is transferred.

As a result, there is provided a VLC encoder, wherein only a 16-bit memory is needed to store a (MPEG and CCITT standard recommendation) 18-bit VLC look-up table for use to encode a source code into a VLC, thereby optimizing the memory space and reducing the system cost.

While the present invention has been described with respect to the preferred embodiments only, other modifications and variations may be made without departing from the spirit and scope of the present invention as set forth in the following claims.

What is claimed is:

1. A method for encoding a digital signal source code into a variable length code for the transmission thereof, comprising the steps of:

converting the source code in a microprocessor into an appropriate form for accessing a table containing variable length code data stored in a 16-bit memory, wherein the table contains a set of variable length codes, each of which has 12 least significant bits to represent a variable length code having a maximum 12-bit length and 4 most significant bits to represent the length thereof, and 13 least significant bits to represent a 13-bit variable length code and 3 most significant bits having the content of all 1's to represent said 13-bit length;

processing a variable length code read from the table to determine the length thereof; and transmitting said processed variable length code of said determined length.

2. The method of claim 1, wherein said converting step includes:

determining the run-length and the level of the source code; and, storing temporarily the sign of the determined level in the microprocessor.

3. The method of claim 2, wherein said transmitting step includes transmitting said sign stored in the microprocessor.

4. The method of claim 1, wherein the source code converted into an appropriate form contains a run-length representing the number of successive zeros and a level representing the value appearing immediately after said successive zeros.

5. The method of claim 1, wherein said processing step includes:

checking whether the content of the 3 most significant bits is all 1's to determine if the variable length code read from the table has the 13-bit length; and, if the content of the 3 most significant bits is not all 1's, determining the length of the variable length code from the 4 most significant bits.

6. An apparatus for encoding a digital signal source code into a variable length code, comprising:

memory means having a plurality of 16-bit memory locations for storing a table of variable length code data which is originally of an 18-bit length, wherein the table contains a set of variable length codes, each of which has 12 least significant bits to represent a variable length code having a maximum 12-bit length and 4 most significant bits to represent the length thereof, and 13 least significant bits to represent a 13-bit variable length code and 3 most significant bits having the content of all 1's to represent said 13-bit length; and a microprocessor including:

(a) means for converting the source code into an appropriate form for accessing the table of variable length code data stored in said memory means;

(b) means for processing a variable length code read from the table to determine the length thereof; and (c) means for transmitting said processed variable length code of said determined length.

7. The apparatus of claim 6, wherein said converting means includes:

means for determining the run-length and the level of the source code; and, means for storing temporarily the sign of the determined level.

8. The apparatus of claims 7, wherein said means for transmitting includes transmitting said sign stored in said converting means.

9. The apparatus of claim 6, wherein the source code converted into an appropriate form contains a run-length representing the number of successive zeros and a level representing the value appearing immediately after said successive zeros.

10. The apparatus of claim 6, wherein said processing means includes:

means for checking whether the content of the 3 most significant bits is all 1's to determine if the variable length code read from the table has the 13-bit length; and, means for determining the length of the variable length code from the 4 most significant bits, if the content of the 3 most significant bits is not all 1's.

* * * * *